United States Patent
Goto

(10) Patent No.: US 10,979,834 B2
(45) Date of Patent: Apr. 13, 2021

(54) AUDIO SIGNAL CONTROL CIRCUIT, AUDIO SYSTEM, AND METHOD OF CONTROLLING AUDIO SIGNAL

(71) Applicant: Yamaha Corporation, Hamamatsu (JP)

(72) Inventor: Mitsutaka Goto, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 16/727,356

(22) Filed: Dec. 26, 2019

(65) Prior Publication Data

US 2020/0213793 A1 Jul. 2, 2020

(30) Foreign Application Priority Data

Dec. 27, 2018 (JP) .............................. JP2018-244328

(51) Int. Cl.
*H03F 3/181* (2006.01)
*H04R 3/00* (2006.01)
*H04R 29/00* (2006.01)

(52) U.S. Cl.
CPC ........... *H04R 29/001* (2013.01); *H03F 3/181* (2013.01); *H04R 3/00* (2013.01); *H03F 2200/03* (2013.01)

(58) Field of Classification Search
CPC ........ H03F 2200/03; H03F 3/181; H03F 1/52; H03F 2200/321; H03F 2200/426; H03F 2200/462; H03F 2200/471; H04R 29/001; H04R 3/00
USPC .................... 381/58, 100, 117, 309
See application file for complete search history.

(56) References Cited

U.S. PATENT DOCUMENTS

| | | | | |
|---|---|---|---|---|
| 4,340,778 A | * | 7/1982 | Cowans | H04R 3/04 381/117 |
| 4,426,552 A | * | 1/1984 | Cowans | H04R 3/04 381/100 |
| 2011/0228945 A1 | | 9/2011 | Mihelich et al. | |
| 2012/0237045 A1 | | 9/2012 | Mihelich et al. | |
| 2013/0336506 A1 | * | 12/2013 | Prentice | H04R 3/00 381/309 |
| 2016/0309270 A1 | * | 10/2016 | Miller | G06F 3/165 |
| 2017/0150281 A1 | * | 5/2017 | Botti | G01R 27/02 |
| 2017/0350923 A1 | * | 12/2017 | Mostert | G01R 31/2825 |
| 2018/0014116 A1 | * | 1/2018 | Roh | H04R 5/04 |
| 2018/0167719 A1 | * | 6/2018 | Hosaka | H04R 17/10 |

(Continued)

FOREIGN PATENT DOCUMENTS

JP 2011-199866 A 10/2011
JP 2013-55676 A 3/2013

*Primary Examiner* — Paul Kim
*Assistant Examiner* — Friedrich Fahnert
(74) *Attorney, Agent, or Firm* — Crowell & Moring LLP

(57) ABSTRACT

An audio signal control circuit includes an impedance calculator, a suppression value setter, a level detector, and a level controller. The impedance calculator is configured to calculate impedance of a speaker from voltage and current of an audio signal to be outputted to the speaker. The suppression value setter is configured to set a suppression value of the audio signal, using the impedance. The level detector is configured to perform level detection using: i) the voltage when the impedance is equal to or more than a switching threshold value, and ii) the current when the impedance is less than the switching threshold value. The level controller is configured to perform level control of the audio signal using: i) a level of a detection signal that has been detected by the level detector, and ii) the suppression value.

9 Claims, 9 Drawing Sheets

(56) References Cited

U.S. PATENT DOCUMENTS

2018/0358937 A1* 12/2018 Nakata ..................... H03F 3/45
2020/0204919 A1* 6/2020 Hedebouw ............... H04R 9/06

* cited by examiner

AUDIO SIGNAL CONTROL CIRCUIT, AUDIO SYSTEM, AND METHOD OF CONTROLLING AUDIO SIGNAL

CROSS REFERENCE TO RELATED APPLICATIONS

This Nonprovisional application claims priority under 35 U.S.C. § 119(a) on Patent Application No. 2018-244328 filed in Japan on Dec. 27, 2018 the entire contents of which are hereby incorporated by reference.

BACKGROUND OF THE INVENTION

1. Technical Field

A preferred embodiment of the present invention relates to an audio signal control circuit, an audio system, and a method of controlling an audio signal that perform suppression processing of an audio signal to be outputted to an amplifier.

2. Description of the Related Art

An existing audio power management system includes a limiter. The audio power management system detects an output of a DAC to be connected to an output stage of the limiter.

The audio power management system compares the output with a threshold value. The audio power management system feeds a result of comparison between the output and the threshold value back to the limiter. The limiter controls power of an audio signal, using the result of comparison, and outputs the audio signal to an amplifier.

In a system such as the above-described prior art, in general, an output is measured by current.

However, in a case in which the impedance of a speaker is high, a current value to be detected is reduced and the detection accuracy of current is reduced. In such a case, the limiter may be unable to suppress an audio signal appropriately, which makes it difficult to securely protect an amplifier provided in an output stage.

SUMMARY OF THE INVENTION

In view of the foregoing, a preferred embodiment of the present invention is designed to provide an audio signal control circuit and a method of controlling an audio signal that are able to suppress an audio signal appropriately according to impedance of a speaker.

An audio signal control circuit includes an impedance calculator that calculates impedance of a speaker from voltage and current of an audio signal to be outputted to the speaker, a suppression value setter that sets a suppression value of the audio signal, using the impedance, a level detector that performs level detection using the voltage when the impedance is equal to or more than a switching threshold value and performs level detection using the current when the impedance is less than the switching threshold value, and a level controller that performs level control of the audio signal, using a level of a detected detection signal and the suppression value.

A preferred embodiment of the present invention is able to suppress an audio signal appropriately according to the impedance of a speaker.

DETAILED DESCRIPTION OF THE PREFERRED EMBODIMENTS

Hardware Configuration of Audio System 1

Figure 1:
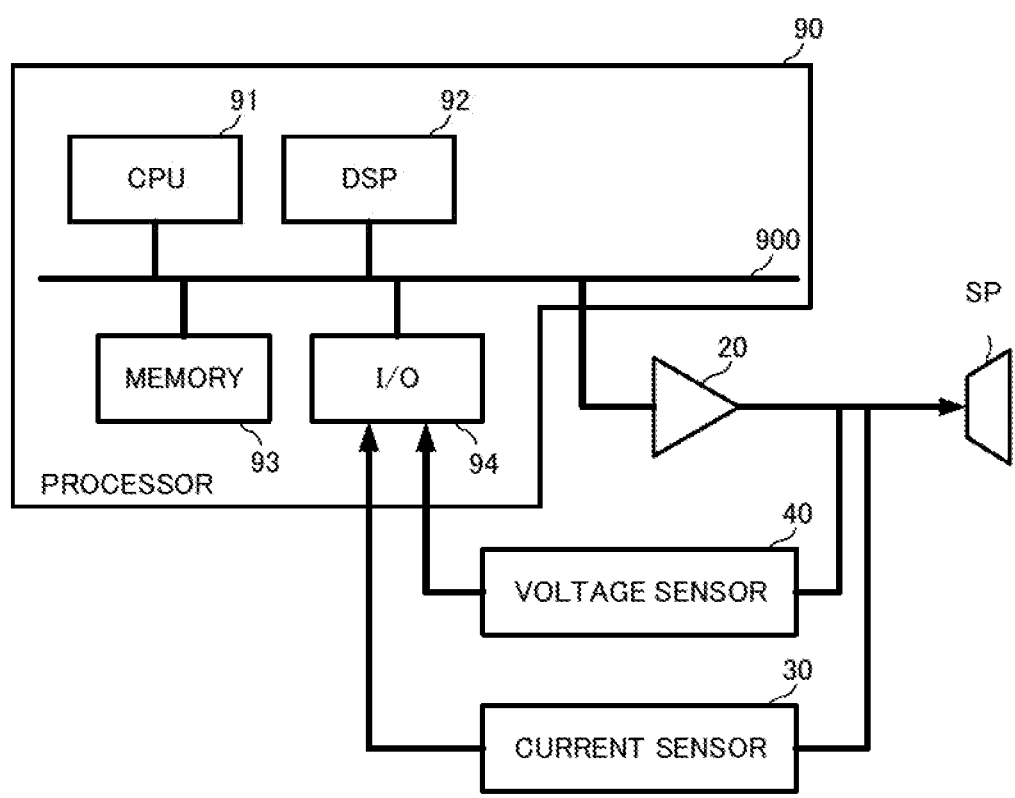
FIG. 1 is a diagram showing a hardware configuration of an audio system 1.

FIG. 1 is a diagram showing a hardware configuration of an audio system 1. As shown in FIG. 1, the audio system 1 includes a processor 90, an amplifier 20, a current sensor 30, a voltage sensor 40, and a speaker SP. The processor 90 includes a bus 900, a CPU 91, a DSP 92, a memory 93, and an I/O 94. The bus 900 connects the CPU 91, the DSP 92, the memory 93, and the I/O 94 mutually.

The memory 93 stores various programs including a program to operate each component of the audio signal control circuit 10. The CPU 91 executes the various programs stored in the memory 93 and achieves the audio signal control circuit 10. In addition, the memory 93 stores a suppression value (a limiter table) or the like according to impedance to be used by a suppression value setter 13 to be described below. The various programs and data are not limited to be stored in the memory 93 in advance but may be stored in an external storage, or in a server or a similar component that is connected to a network. In such a case, the CPU 91 reads various programs and data from the server and the similar component.

An input end of the amplifier 20 is connected to the processor 90. The amplifier 20 outputs an audio signal to an input end of the speaker SP. In addition, the current sensor 30 and the voltage sensor 40 receive an input of an output signal from the amplifier 20, and each sensor outputs a detected signal to the I/O 94 of the processor 90.

Configuration of Audio System 1

Figure 2:
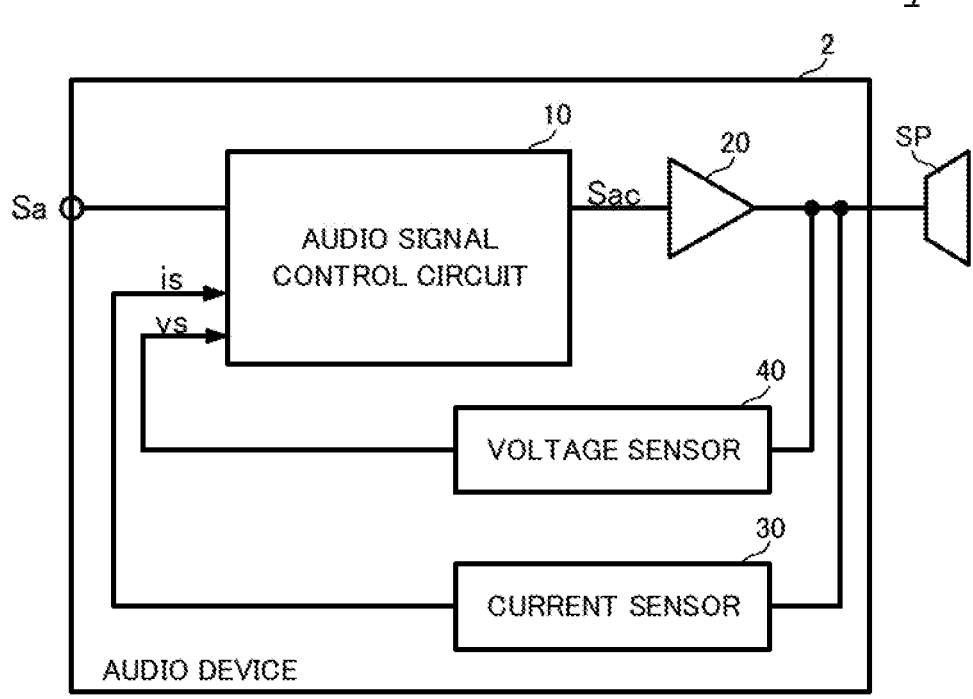
FIG. 2 is a block diagram showing a configuration of the audio system 1.

FIG. 2 is a block diagram showing the entire configuration of the audio system 1. As shown in FIG. 2, the audio system 1 includes an audio device 2 and a speaker SP. The audio device 2 is connected to the speaker SP in an output stage. The audio device 2 outputs an audio signal to the speaker SP.

The speaker SP is a high impedance speaker, for example. The high impedance speaker includes a transformer in an input stage of an audio signal, for example. The impedance of the high impedance speaker is adjusted by the control of this transformer. The impedance of the high impedance speaker alone may range from about several tens of ohms to about several hundreds of ohms. In this manner, the impedance of the high impedance speaker is high, so that the high impedance speaker is able to reproduce sound of desired sound quality regardless of the length of a transmission cable between the speaker and the audio device 2. It is to be noted that rated impedance (rated resistance) of a high impedance speaker is 8Ω and a specific resistance value more than 8Ω, and is impedance that guarantees operation.

In addition, the audio system 1 may connect a plurality of speakers to one amplifier in parallel, depending on a use. In such a case, an impedance value of the speaker to the amplifier varies depending on the relationship between the amount of total power of the speakers to be connected and the rated output of the amplifier. For example, compared with the impedance value in connecting a high impedance speaker alone, the impedance value in connecting a plurality of speakers is reduced.

The audio device 2 includes an audio signal control circuit 10, an amplifier 20, a current sensor 30, and a voltage sensor 40.

The audio signal control circuit 10 is connected to the amplifier 20. The amplifier 20 is connected to a speaker SP. The current sensor 30 and the voltage sensor 40 are connected to an output end of the amplifier 20, in other words, an input end of the speaker SP. The current sensor 30 and the voltage sensor 40 are connected to the audio signal control circuit 10.

Schematically, each component of the audio device 2 performs the following operation. The current sensor 30 measures the current of an audio signal that the amplifier 20 has outputted. The current sensor 30 outputs (feeds back) the measured current is to the audio signal control circuit 10. The voltage sensor 40 measures the voltage of an audio signal that the amplifier 20 has outputted. The voltage sensor 40 outputs (feeds back) the measured voltage vs to the audio signal control circuit 10.

The audio signal control circuit 10 calculates impedance Z of the speaker SP from the current is and the voltage vs. The audio signal control circuit 10 switches the level detection using the current is and the level detection using the voltage vs, based on the impedance Z of the speaker SP.

This is because of the following reasons. For example, in a case in which power supply is constant, the output load (voltage) to the speaker SP is guaranteed to 100 V. In such a case, the current is is reduced as the impedance Z of the speaker SP is increased. In addition, due to the problem of the measurement accuracy of the current sensor 30, when the current is is less than 1 A, for example, the measurement accuracy of the current is is reduced. On the other hand, even when the impedance Z of the speaker SP is large, the measurement accuracy of the voltage vs is not reduced. In addition, when the impedance is small, the measurement accuracy of the current is is not reduced. Therefore, when the impedance is small, it is preferable to use the current is. On the other hand, it is preferable to use the voltage vs when the impedance is large.

The audio signal control circuit 10 stores in advance a switching threshold value Zr to switch the level detection using the current is and the level detection using the voltage vs. The audio signal control circuit 10 performs the level detection using the voltage vs when the impedance Z is equal to or more than the switching threshold value Zr. The audio signal control circuit 10 performs the level detection using the current is when the impedance Z is less than the switching threshold value Zr. Accordingly, the audio signal control circuit 10, without depending on the impedance Z of the speaker SP, is able to detect with high accuracy the level of the audio signal to be outputted from the amplifier 20. Herein, the level of an audio signal refers to an envelope of the amplitude absolute values of the waveform of an audio signal, or an average value of the amplitude absolute values, for example. The waveform of an audio signal refers to a voltage waveform or a current waveform.

In addition, the audio signal control circuit 10 sets a suppression value GR corresponding to the magnitude of the impedance Z.

The audio signal control circuit 10, using the level of an audio signal and the suppression value GR, adjusts the level of an audio signal Sa and outputs the audio signal to the amplifier 20. The level of an audio signal is detected with high accuracy as described above. The suppression value GR is set according to the impedance Z. Accordingly, the audio signal control circuit 10 is able to suppress the level of an audio signal appropriately according to the impedance Z of the speaker SP. Therefore, an audio signal of an excessive level is suppressed from being inputted to the amplifier 20. As a result, the audio signal control circuit is able to more securely protect each component of an electric circuit of the amplifier 20.

The amplifier 20 amplifies an audio signal Sac of which the level has been suppressed by the audio signal control circuit 10, and outputs the audio signal to the speaker SP.

Configuration of Audio Signal Control Circuit 10

Figure 3:
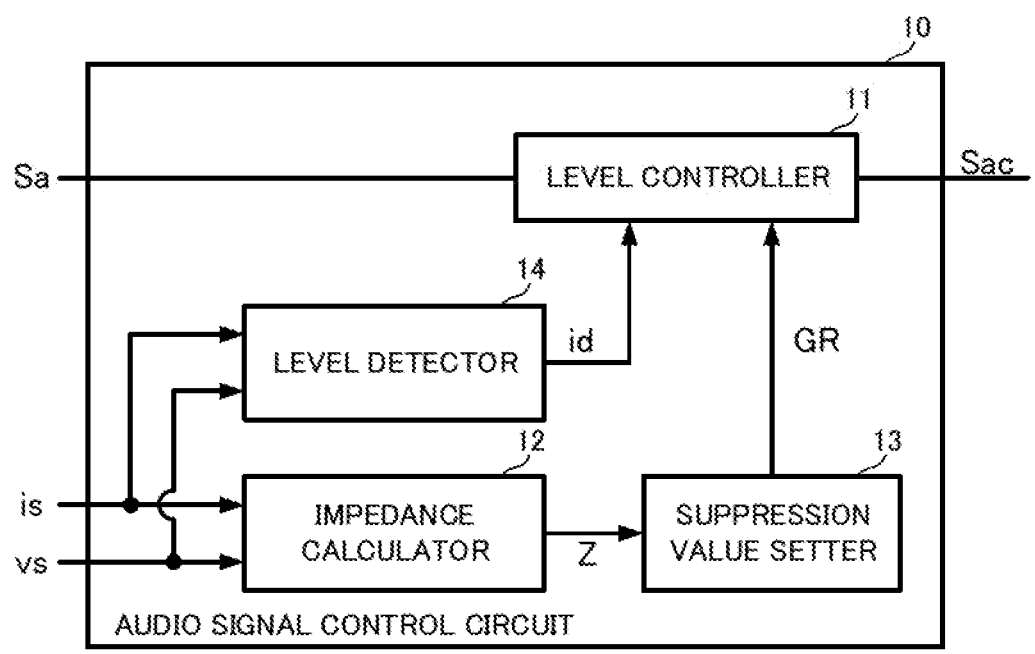
FIG. 3 is a block diagram showing a configuration of an audio signal control circuit 10.

FIG. 3 is a block diagram showing a configuration of the audio signal control circuit 10. As shown in FIG. 3, the audio signal control circuit 10 includes a level controller 11, an impedance calculator 12, a suppression value setter 13, and a level detector 14.

The impedance calculator 12 calculates impedance Z of the speaker SP by dividing the voltage vs that has been measured by the voltage sensor 40 by the current is that has been measured by the current sensor 30. The impedance calculator 12 outputs calculated impedance Z to the suppression value setter 13.

Figure 4:
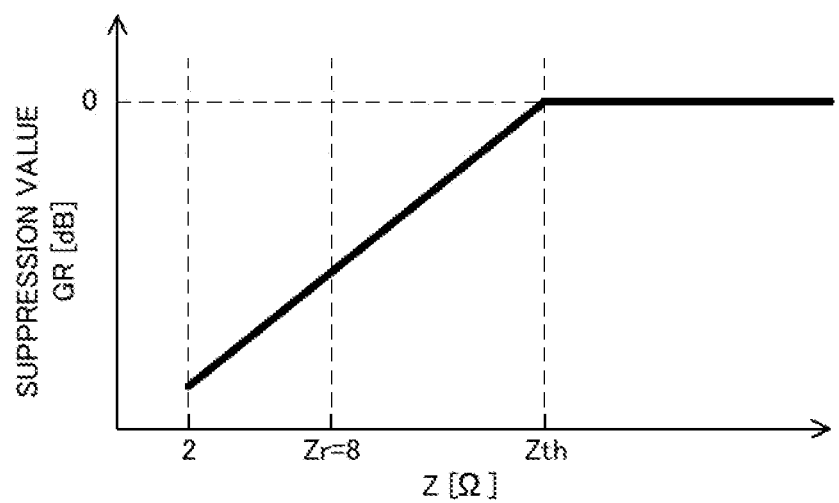
FIG. 4 is a graph showing a relationship between impedance Z and a suppression value GR.

The suppression value setter 13 sets a suppression value GR based on the impedance Z. FIG. 4 is a graph showing a relationship between the impedance Z and the suppression value GR. In FIG. 4, the vertical axis indicates the suppression value GR and the horizontal axis indicates the impedance Z of the speaker SP.

As shown by the solid line of FIG. 4, the suppression value GR is set corresponding to the impedance Z. More specifically, in the range in which the impedance Z is less than specified impedance Zth, as shown by the solid line of FIG. 4, the suppression value GR approaches 0 [dB] as the impedance Z approaches the specified impedance Zth (as the impedance Z is increased). On the other hand, as shown by the solid line of FIG. 4, the suppression value GR has a negative value with a greater absolute value as the impedance Z is away from the specified impedance Zth (as the impedance Z is reduced). In other words, in the range in which the impedance Z is less than the specified impedance Zth, the absolute suppression value GR is reduced as the impedance Z is increased. For example, as shown in FIG. 4, the suppression value GR in a case in which the impedance Z is 8Ω (=Zr) is close to 0 [dB], as compared with the suppression value GR in a case in which the impedance Z is 2Ω. In other words, the absolute suppression value GR in a case in which the impedance Z is 8Ω (=Zr) is small, as compared with the absolute suppression value GR in a case in which the impedance Z is 2Ω. Therefore, the suppression value GR in the case in which the impedance Z is 8Ω (=Zr) is smaller than the suppression value GR in the case in which the impedance Z is 2Ω.

In a case in which the impedance Z of the speaker SP is small, compared with a case in which the impedance Z of the speaker SP is large, the current value to be inputted to the speaker SP is increased. Therefore, it is preferable to set the suppression value GR to be greater in the case in which the impedance Z of the speaker SP is small than in the case in which the impedance Z of the speaker SP is large. Therefore, as shown in FIG. 4, the suppression value GR is reduced as the impedance Z is increased, so that the suppression value setter 13 is able to set an appropriate suppression value GR. The suppression value setter 13 outputs a set suppression value GR to the level controller 11.

It is to be noted that the suppression value setter 13 sets the suppression value GR to be constant (0 dB, for example) in a case in which the impedance Z is equal to or more than the specified impedance Zth. In the case in which the impedance Z is equal to or more than the specified impedance Zth, the current value to be inputted in the speaker SP is extremely reduced. Therefore, even when an audio signal is hardly suppressed, the audio signal of an excessive level is not inputted to the amplifier 20.

Conversely, when an audio signal is suppressed in the case in which the impedance Z is equal to or more than the specified impedance Zth, the level of the audio signal is reduced excessively. Such an excessive reduction in the level of the audio signal causes degradation of sound quality. Therefore, in the case in which the impedance Z is equal to or more than the specified impedance Zth, it is preferable not to suppress an audio signal.

It is to be noted that the specified impedance Zth is a specific value more than 8Ω (=Zr) being the minimum value of the rated impedance, and may be 80Ω, for example. The specified impedance Zth is not limited to 80Ω as long as being more than 8Ω, and may be set according to the specification of the amplifier 20 or the speaker SP, for example.

Figure 5:
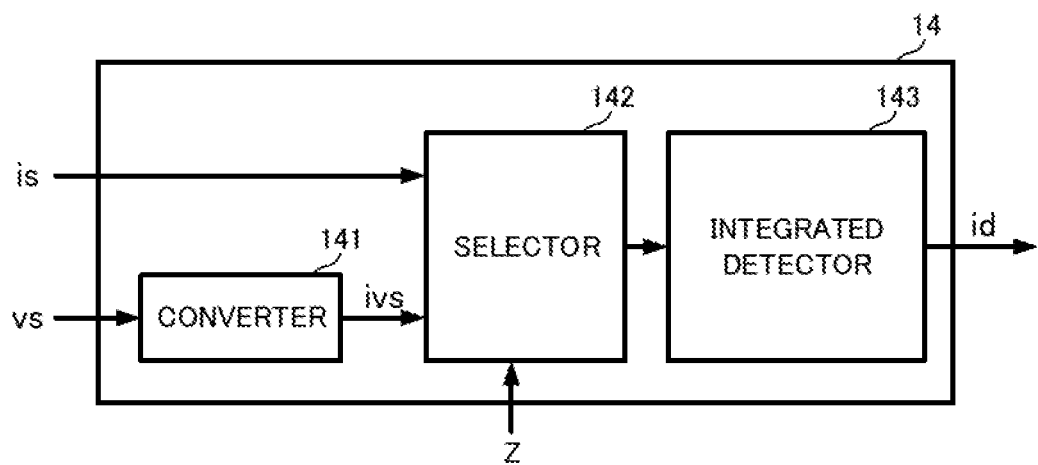
FIG. 5 is a block diagram showing a configuration of a level detector 14.

FIG. 5 is a block diagram showing a configuration of the level detector 14. As shown in FIG. 5, the level detector 14 includes a converter 141, a selector 142, and an integrated detector 143.

The converter 141 calculates current ivs by dividing the voltage vs by a resistance value for conversion to a current value. The converter 141 outputs the current ivs that has been converted from the voltage vs to the selector 142. It is to be noted that the resistance value for conversion may be 8Ω being the minimum value of the rated impedance, for example.

The selector 142, when the impedance Z is less than the switching threshold value (the resistance value) Zr, selects the current is and outputs the current is to the integrated detector 143. The selector 142 is able to obtain the impedance Z from a calculation result of the impedance calculator 12, for example. When the impedance Z is equal to or more than the switching threshold value Zr, the selector 142 selects the current ivs that has been converted from the voltage vs, and outputs the current ivs to the integrated detector 143.

The switching threshold value Zr may be 8Ω being the minimum value of the rated impedance of a high impedance speaker, for example. In a case in which the impedance Z is equal to or more than 8Ω, the speaker SP is able to be regarded as a high impedance speaker in terms of a specification.

As described above, in a case in which power supply is constant, and the output load (the voltage) to the speaker SP is set to 100 V, the current is is reduced as the impedance Z of the speaker SP is increased. In addition, due to the problem of the measurement accuracy of the current sensor 30, when the current is is less than 1 A, for example, the measurement accuracy of the current is is reduced. On the other hand, even when the impedance Z of the speaker SP is large, the measurement accuracy of the voltage vs is not reduced.

Specifically, for example, the current is is reduced when the impedance Z is equal to or more than 8Ω. The current is is further reduced as the impedance Z is increased. Therefore, the accuracy of the level detection using the current is when the impedance Z is equal to or more than 8Ω is reduced, and the level detection using the voltage vs is provides higher accuracy.

Therefore, the minimum value 8Ω of the rated impedance of a high impedance speaker is the switching threshold value Zr. The level detector 14, when the impedance Z is equal to or more than the switching threshold value Zr, switches the level detection using the current is to the level detection using the voltage vs. Accordingly, the level detector 14 is able to detect the level of an audio signal with high accuracy.

In the case in which the impedance Z is equal to or more than 8Ω, the level controller 11 uses a suppression value GR corresponding to the impedance Z as described above, to the audio signal of which the level has been detected with high accuracy in this manner. Accordingly, even when the impedance Z is equal to or more than 8Ω, the level controller 11 is able to suppress an audio signal appropriately.

The integrated detector 143, when receiving the current is, performs level detection by performing integrated detection of the current is. The integrated detector 143 outputs a detection signal id of which the level has been detected. The integrated detector 143, when receiving the current ivs that has been converted from the voltage vs, performs level detection by performing integrated detection of this current ivs. The integrated detector 143 outputs the detection signal id of which the level has been detected. The level of the detection signal id is increased in proportion to the intensity (amplitude) of the current is or the current ivs converted from the voltage vs. The integrated detector 143 outputs the detection signal id to the level controller 11.

It is to be noted that the converter 141 is also able to use the impedance Z calculated by the impedance calculator 12 for a resistance value for conversion. However, the resistance value for conversion is preferably 8Ω being the minimum value of the rated impedance.

As described above, the minimum value of the rated impedance (impedance defined as a rating) of the speaker SP is 8Ω. Therefore, the impedance of the speaker SP is generally more than 8Ω, in many cases. In such a case, when the impedance Z calculated by the impedance calculator 12 is used as the resistance value for conversion, the value of the current ivs is smaller than when the minimum value 8Ω of the rated impedance is used as the resistance value for conversion. Therefore, when the impedance Z calculated by the impedance calculator 12 is used as the resistance value for conversion, the sensitivity of level detection is reduced. Conversely, when the minimum value 8Ω of the rated impedance is used as the resistance value for conversion, the sensitivity of level detection is improved. Therefore, the resistance value for conversion is preferably 8Ω being the minimum value of the rated impedance.

The level controller 11 receives an input of an audio signal Sa, a detection signal id, and a suppression value GR. The level controller 11 is a so-called compressor or limiter. The level controller 11 detects whether the level of the detection signal id is equal to or more than a threshold value for suppression. The level controller 11, when the level of the detection signal id is equal to or more than the threshold value for suppression, suppresses the level of the audio signal Sa using the suppression value GR. The level controller 11 outputs an audio signal Sac that has been suppressed to the amplifier 20.

As described above, in the case in which the impedance Z is equal to or more than 8Ω and is less than the specified impedance Zth, the suppression value GR is set corresponding to the magnitude of the impedance Z. Accordingly, the audio signal control circuit 10 is able to suppress an audio signal using the suppression value GR corresponding to the impedance Z. Therefore, the audio signal control circuit 10 is able to protect the amplifier 20 more securely, according to the impedance Z.

In addition, as described above, the audio signal control circuit 10 is able to detect the level of an audio signal with high accuracy even when the impedance Z is large. Therefore, the audio signal control circuit 10 is able to suppress the level of the audio signal Sa with high accuracy. Accordingly, the audio signal control circuit 10 is able to protect the amplifier 20 more securely.

In addition, when the impedance Z is equal to or more than the specified impedance Zth, current is particularly reduced. Therefore, even when an audio signal is not suppressed, the breakage of the amplifier 20 hardly occurs. On the other hand, since the current is small, even when the suppression value GR is small, the level of an audio signal is reduced excessively. Therefore, the audio signal control circuit 10 is able to reduce excessive suppression of an audio signal by setting the suppression value GR to "0" in the case in which the impedance Z is equal to or more than the specified impedance Zth.

In addition, in the case in which the impedance Z is less than 8Ω, the suppression value GR is increased as the impedance Z is reduced. Accordingly, an audio signal of an excessive level is suppressed from being outputted to the amplifier 20, and the audio signal control circuit 10 is able to protect the amplifier 20 more securely.

First Processing of Method of Controlling Audio Signal

Figure 6:
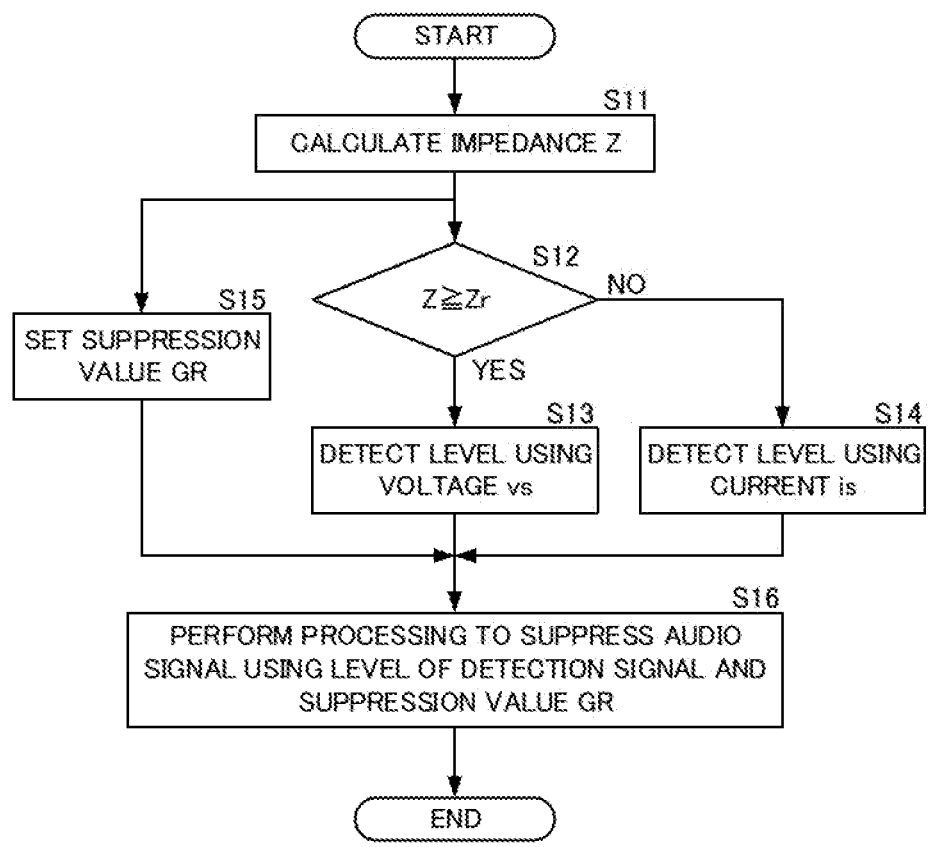
FIG. 6 is a flow chart showing a first processing flow of a method of controlling an audio signal.

FIG. 6 is a flow chart showing a first processing flow of a method of controlling an audio signal. It is to be noted that detailed description of each processing of FIG. 6 is the same as the description of the above configuration, and a description of the same or similar configuration will be omitted.

As shown in FIG. 6, an arithmetic device calculates impedance Z of a speaker SP from current is and voltage vs of an audio signal to be inputted to the speaker SP (S11).

The arithmetic device performs level detection (level detection using the current ivs converted from the voltage vs) using the voltage vs when the impedance Z is equal to or more than a switching threshold value Zr (S12: YES) (S13). The arithmetic device performs the level detection using the current is when the impedance Z is less than the switching threshold value Zr (S12: NO) (S14).

In addition, the arithmetic device sets a suppression value GR corresponding to the impedance Z as processing different from the level detection (S15). For example, the arithmetic device performs the level detection and setting of the suppression value GR in parallel.

The arithmetic device performs suppression processing of an audio signal using two results of the level of a detection signal id of the level detection performed in Step S13 or Step S14 and the suppression value GR set in Step S15 (S16).

Configuration of Audio System 1A

Figure 7:
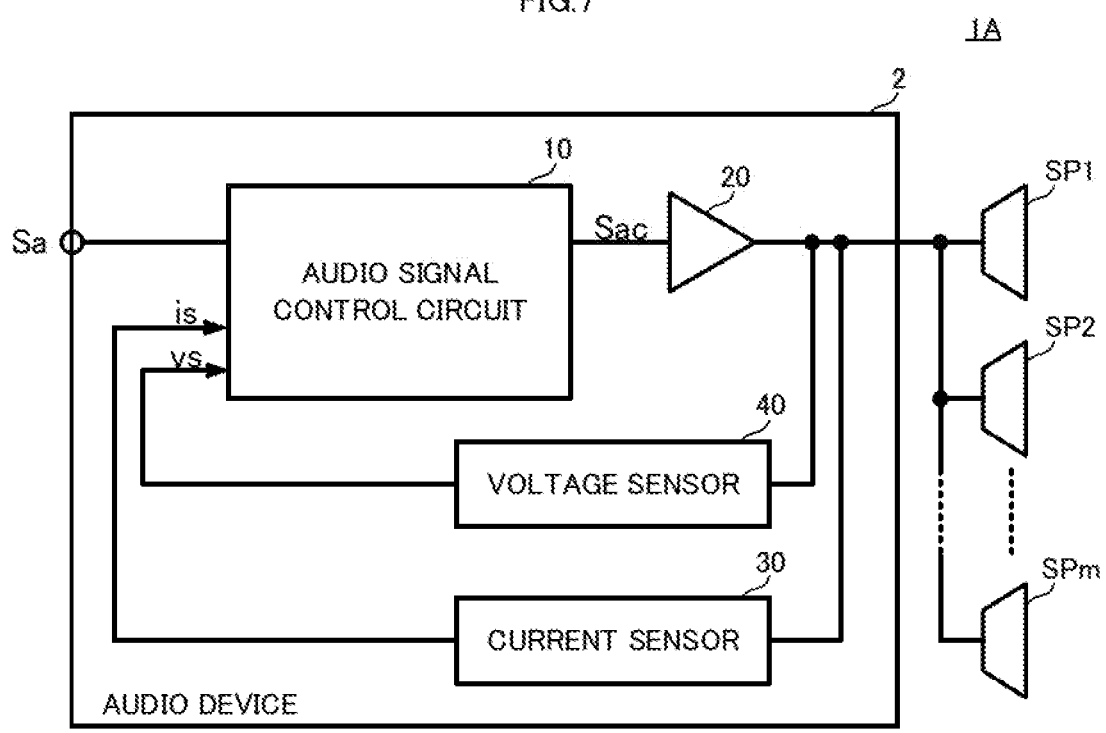
FIG. 7 is a block diagram showing a configuration of an audio system 1A.

FIG. 7 is a block diagram showing a configuration of an audio system 1A. The audio system 1A is different from the above audio system 1 in that the audio system 1A includes a plurality of speakers, for example, m (m is an integer of 2 or more) speakers including a speaker SP1, a speaker SP2, . . . , a speaker SPm. Other configurations of the audio system 1A are the same as or similar to the configurations of the audio system 1, and a description of the same or similar configuration will be omitted.

As shown in FIG. 7, the speaker SP1, the speaker SP2, . . . , the speaker SPm are connected in parallel to an output end of the amplifier 20. The current sensor 30 measures current is at the output end of the amplifier 20. The voltage sensor 40 measures voltage vs at the output end of the amplifier 20. In other words, the output end of the amplifier 20 is an input end of a speaker system including the speaker SP1, the speaker SP2, . . . , the speaker SPm that are connected in parallel to each other.

With such a configuration, the impedance Z of the speaker system changes with the number of speakers that are connected in parallel to each other. However, with the above configuration, even when the impedance Z changes, the audio signal control circuit 10 of the audio device 2 is able to detect the level of an audio signal with high accuracy, according to the impedance Z. In addition, the audio signal control circuit 10 is able to set a suppression value GR corresponding to the impedance Z. As a result, according to a preferred embodiment of the speaker system, an audio signal is able to be suppressed to an appropriate level and the amplifier 20 is able to be protected more securely.

Configuration of Audio Signal Control Circuit 10A

Figure 8:
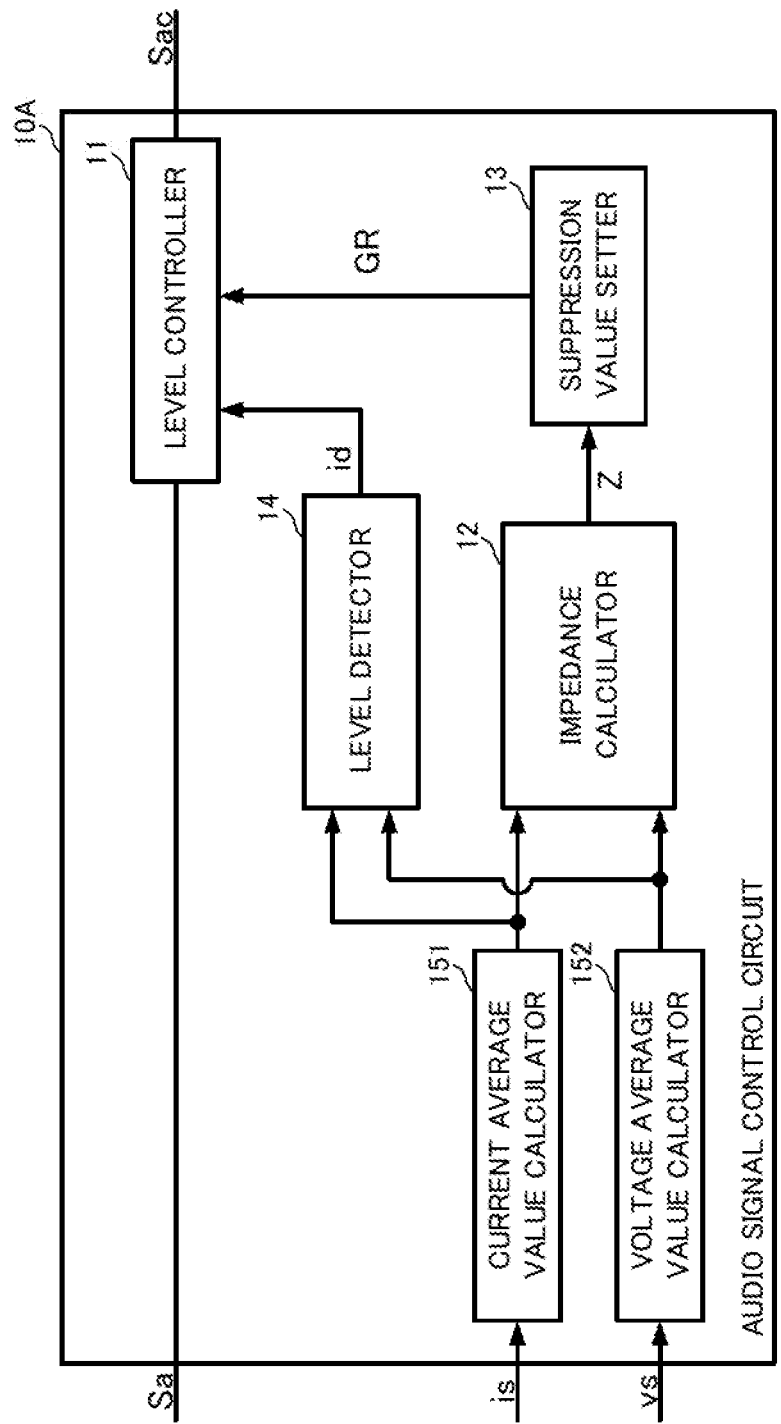
FIG. 8 is a block diagram showing a configuration of an audio signal control circuit 10A.

FIG. 8 is a block diagram showing a configuration of the audio signal control circuit 10A. As shown in FIG. 8, the audio signal control circuits 10A is different from the audio signal control circuit 10 in that the audio signal control circuits 10A includes a current average value calculator 151 and a voltage average value calculator 152. Other configurations of the audio signal control circuit 10A are the same as or similar to the configurations of the audio signal control circuit 10, and a description of the same or similar configuration will be omitted.

The current average value calculator 151 calculates a mean square value of inputted current is. In such a case, the mean square value is a moving average value. The current average value calculator 151 outputs the mean square value of the current is to the impedance calculator 12 and the level detector 14.

The voltage average value calculator 152 calculates a mean square value of inputted voltage vs. In such a case, the mean square value is a moving average value. The voltage average value calculator 152 outputs the mean square value of the voltage vs to the impedance calculator 12 and the level detector 14.

With such a configuration, the current average value calculator 151 is able to suppress the effect of noise superimposed on the current is. In addition, the voltage average value calculator 152 is able to suppress the effect of noise superimposed on the voltage vs.

The impedance calculator 12 calculates the impedance Z by dividing the mean square value of the voltage vs by the mean square value of the current is. Accordingly, the impedance calculator 12 is able to calculate the impedance Z with high accuracy.

The level detector 14, by using the mean square value of the voltage vs or the mean square value of the current is, is able to detect the level of an audio signal with high accuracy.

The audio signal, due to level clipping or the like, may have a substantially square waveform or the like, instead of a sine waveform. However, with such a configuration, the impedance calculator 12 is able to calculate the impedance Z of the audio signal having such a waveform, with high accuracy. Similarly, the level detector 14 is able to detect the level of the audio signal with high accuracy.

Second Processing of Method of Controlling Audio Signal

Figure 9:
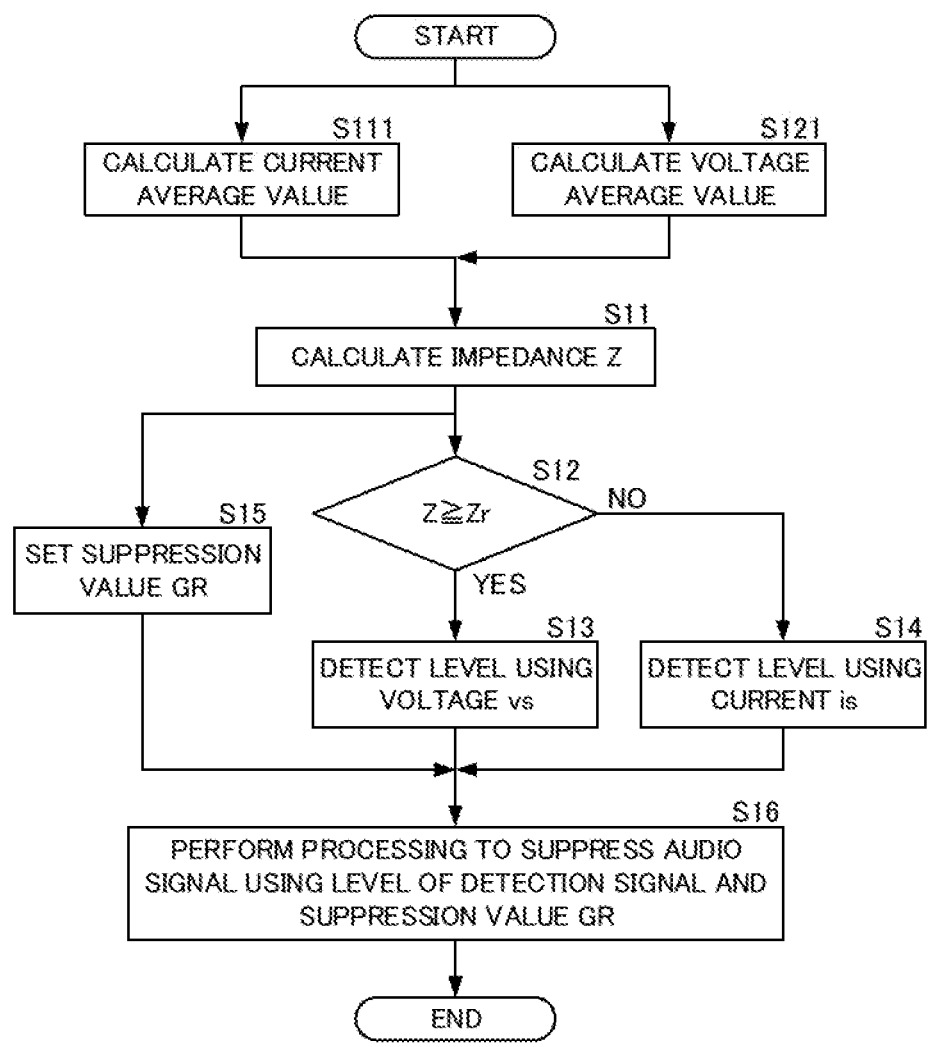
FIG. 9 is a flow chart showing a second processing flow of the method of controlling an audio signal.

With respect to the configuration of FIG. 8, the method of controlling an audio signal includes a flow as shown in FIG. 9. FIG. 9 is a flow chart showing a second processing flow of the method of controlling an audio signal.

As shown in FIG. 9, the second processing of the method of controlling an audio signal includes calculation processing of a current average value and calculation processing of a voltage average value in addition to the first processing shown in FIG. 6. Other processing in the second processing flow of the method of controlling an audio signal shown in FIG. 9 is the same as or similar to the processing of the first processing shown in FIG. 6, and a description of the same or similar processing will be omitted.

An arithmetic device calculates a mean square value of current is (S111). The arithmetic device calculates a mean square value of voltage vs (S121). The arithmetic device calculates the impedance Z by dividing the mean square value of the voltage vs by the mean square value of the current is (S11). Subsequently, the arithmetic device suppresses an audio signal to an appropriate level by executing processing from Step S12 to Step S16.

Finally, the present preferred embodiment is illustrative in all points and should not be construed to limit the present invention. The scope of the present invention is defined not by the foregoing preferred embodiment but by the following claims. Further, the scope of the present invention is intended to include all modifications within the scopes of the claims and within the meanings and scopes of equivalents.

What is claimed is:

1. An audio signal control circuit comprising:
   an impedance calculator that is configured to calculate impedance of a speaker from measured voltage and measured current of an audio signal outputted to the speaker;
   a suppression value setter that is configured to set a suppression value of the audio signal, using the impedance;
   a level detector that is configured to perform level detection using:
      i) the measured voltage when the impedance is equal to or more than a switching threshold value, and
      ii) the measured current when the impedance is less than the switching threshold value,
      the switching threshold value being stored in advance to switch the level detection using the measured voltage and the level detection using the measured current; and
   a level controller that is configured to perform level control of the audio signal using:
      i) a level of a detection signal that has been detected by the level detector, and
      ii) the suppression value.

2. The audio signal control circuit according to claim 1, wherein
   the suppression value setter is configured to set the absolute suppression value to be reduced as the impedance is increased, in a case in which the impedance is less than specified impedance higher than impedance defined by rating of the speaker.

3. The audio signal control circuit according to claim 1, wherein the level detector includes a converter that is configured to convert the measured voltage to current, and the level detector is configured to perform the level detection using the current that has been converted from the measured voltage in the converter.

4. The audio signal control circuit according to claim 1, further comprising:
   a current average value calculator that is configured to calculate an average value of the measured current; and
   a voltage average value calculator that is configured to calculate an average value of the measured voltage, wherein
      the impedance calculator is configured to calculate the impedance, using the average value of the measured current and the average value of the measured voltage,
      the level detector is configured to perform the level detection using the average value of the measured voltage, and
      the level detector is configured to perform the level detection using the average value of the measured current.

5. An audio system comprising:
   the audio signal control circuit according to claim 1; and
   an amplifier connected to an output stage of the level controller, wherein
      the speaker is connected to an output stage of the amplifier, and
      the speaker is a high impedance speaker.

6. A method of controlling an audio signal, comprising:
   calculating impedance of a speaker from measured voltage and measured current of an audio signal outputted to the speaker;
   setting a suppression value of the audio signal, using the impedance;
   performing level detection:
      i) using the measured voltage when the impedance is equal to or more than a switching threshold value, and
      ii) using the measured current when the impedance is less than the switching threshold value,
         the switching threshold value being stored in advance to switch the level detection using the measured voltage and the level detection using the measured current; and
   performing level control of the audio signal using:
      i) a level of the audio signal of which the level has been detected, and
      ii) the suppression value.

7. The method of controlling an audio signal according to claim 6, wherein the absolute suppression value is set to be reduced as the impedance is increased, in a case in which the impedance is less than specified impedance higher than impedance defined by rating of the speaker.

8. The method of controlling an audio signal according to claim 6, further comprising:
   converting the measured voltage to current, wherein
      the level detection using the measured voltage is performed by using the current that has been converted from the measured voltage.

9. The method of controlling an audio signal according to claim 6, further comprising:
   calculating an average value of the measured current; and
   calculating an average value of the measured voltage, wherein
      the impedance is calculated using the average value of the measured current and the average value of the measured voltage,
      the level detection using the measured voltage is performed by using the average value of the measured voltage, and the level detection using the measured current is performed by using the average value of the measured current.

\* \* \* \* \*